US008533643B2

(12) United States Patent
Guo et al.

(10) Patent No.: US 8,533,643 B2
(45) Date of Patent: Sep. 10, 2013

(54) METHOD AND APPARATUS FOR PERFORMING TEMPLATE-BASED CLASSIFICATION OF A CIRCUIT DESIGN

(75) Inventors: Weiqing Guo, Los Altos, CA (US);
Thomas D. Burd, Fremont, CA (US);
Arun Chandra, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 47 days.

(21) Appl. No.: 12/971,442

(22) Filed: Dec. 17, 2010

(65) Prior Publication Data
US 2012/0159409 A1 Jun. 21, 2012

(51) Int. Cl.
*G06F 17/50* (2006.01)

(52) U.S. Cl.
USPC ........................................ 716/101

(58) Field of Classification Search
USPC ................................. 716/100, 101
See application file for complete search history.

(56) References Cited

U.S. PATENT DOCUMENTS

| | | | | |
|---|---|---|---|---|
| 5,463,561 | A * | 10/1995 | Razdan | 716/103 |
| 5,694,579 | A * | 12/1997 | Razdan et al. | 703/14 |
| 6,405,348 | B1 * | 6/2002 | Fallah-Tehrani et al. | 716/113 |
| 6,499,129 | B1 * | 12/2002 | Srinivasan et al. | 716/113 |
| 6,829,755 | B2 * | 12/2004 | Gutwin et al. | 716/113 |
| 6,851,095 | B1 * | 2/2005 | Srinivasan et al. | 716/113 |
| 7,000,202 | B1 * | 2/2006 | Srinivasan et al. | 716/108 |
| 7,117,461 | B1 * | 10/2006 | Srinivasan et al. | 716/113 |
| 7,337,416 | B1 * | 2/2008 | Srinivasan et al. | 716/52 |
| 7,340,698 | B1 * | 3/2008 | Srinivasan et al. | 716/113 |
| 2003/0037306 | A1 * | 2/2003 | Gutwin et al. | 716/6 |
| 2006/0101358 | A1 * | 5/2006 | Shah et al. | 716/4 |
| 2009/0164194 | A1 * | 6/2009 | Shrivastava et al. | 703/14 |

* cited by examiner

*Primary Examiner* — Suchin Parihar
(74) *Attorney, Agent, or Firm* — Volpe and Koenig, P.C.

(57) ABSTRACT

A method and apparatus for performing template-based classification of a circuit design are disclosed. A template file is read that defines a plurality of channel-connected-region (CCR) templates. A graph is formatted for each of the CCR templates. A plurality of CCRs are identified based on a partitioned netlist file that defines a given circuit design. A graph is generated for each of the identified CCRs. A matching CCR template graph is identified for each generated CCR graph. The template file may further defines super-CCR templates, and a graph may be formatted for each of the super-CCR templates. All possible combinations of CCRs and previously-matched super-CCRs that are candidates to match the formatted super-CCR template graph may be determined in an interative manner, for each formatted super-CCR template graph. A determination may be made as to which of the candidate combinations actually match the formatted super-CCR template graph.

20 Claims, 11 Drawing Sheets

FIG. 6

* region: colb[0]/io/I10/N0

*% PROVEN: TPCS_ND2 x1.36

*!property CCR type = c.nd2

*% mapped_input: colb[0]/io/net0108 => TPCS_ND2:A

*!property PORT dynamic_fanin = true

*% mapped_input: colb[0]/io/net089 => TPCS_ND2:B

*!property PORT dynamic_fanin = true

*% mapped_output: colb[0]/io/net20 => TPCS_ND2:Z

*!property PORT dynamic_fanout = true

*% mapped_device: colb[0]/io/I10/N0 => TPCS_ND2/N0

*% mapped_device: colb[0]/io/I10/N1 => TPCS_ND2/N1

*% mapped_device: colb[0]/io/I10/P0 => TPCS_ND2/P0

*% mapped_device: colb[0]/io/I10/P1 => TPCS_ND2/P1

*% CANDIDATE: TPCS_ND2

* inputs: colb[0]/io/net0108 colb[0]/io/net089

* outputs: colb[0]/io/net20

* supplies: VDD VNSUB VPSUB VSS

Mcolb[0]/io/I10/N0 colb[0]/io/net20 colb[0]/io/net0108 colb[0]/io/I10/n01 VNSUB TNSSFH W=1.36 L=0.04 $ Mcolb[0]/io/I10/N1 colb[0]/io/I10/n01 colb[0]/io/net089 VSS VNSUB TNSSFH W=1.36 L=0.04 $ Mcolb[0]/io/I10/P0 colb[0]/io/net20 colb[0]/io/net0108 VDD VPSUB TPSSFH W=1.07 L=0.04 $ Mcolb[0]/io/I10/P1 colb[0]/io/net20 colb[0]/io/net089 VDD VPSUB TPSSFH W=1.07 L=0.04 $

* end_region

* region: TPCS_ND2_IV1

* inputs: A

* outputs: Z

* supplies: VDD VSS

*!property CCR type=c.nd2

*!property port A dynamic_fanin=true

*!property port Z dynamic_fanout=true

*!constraint zc A,Z

*!WEFF Z DOWN (N0 + N1)

*!WEFF Z UP (P0)

* IV1: A  B -> A A

MN0 Z A w0 VNSUB TNTMP W=1 L=0.04

MN1 Z w0 VSS VNSUB TNTMP W=1 L=0.04

MP0 Z A VSS VPSUB TPTMP W=1 L=0.04

* end_region

FIG. 9

METHOD AND APPARATUS FOR PERFORMING TEMPLATE-BASED CLASSIFICATION OF A CIRCUIT DESIGN

FIELD OF INVENTION

This application is related to circuit topology used for designing an electronic circuit.

BACKGROUND

Simulation Program with Integrated Circuit Emphasis (SPICE) is a software program that simulates electronic circuits. Using SPICE, any voltage or current waveform in a circuit can be analyzed. SPICE calculates these voltages and currents versus time or frequency.

Currently, SPICE is available from many vendors who have added schematic drawing tools to the front end and graphics post-processors to plot the results. SPICE simulators and applications have expanded to analog and digital circuits, microwave devices, and electromechanical systems.

SPICE operates by describing a circuit in a text file called a circuit netlist, and then running a simulation. A collection of circuits is typically available for the user of SPICE to retrieve and modify as desired. SPICE reads the circuit netlist and then performs the requested analysis. The results are stored in a text output file or a binary data file. The results of the simulation may be viewed in a text output file using a text editor. Most SPICE programs provide a graphical viewer to plot waveforms stored in the binary data file.

Classification is used to recognize the circuit behavior defined by a netlist. It identifies related transistors that perform an operation such as those performed by logic functions (e.g. AND, OR, NOT, etc.) or state elements (e.g., latches, flip-flops, etc.). The collection of all these operations defines the overall circuit behavior. Classification is especially useful for electrical and logical analysis of custom circuits (transistor-level) in which the netlist hierarchy, if it exists, does not represent the operational hierarchy from which the overall circuit behavior can be determined. These custom circuits are typically found in processors (e.g., central processing units (CPUs), graphics processing units (GPUs), and the like), and most other high-performance integrated circuits (ICs). When rule-based classification (i.e., structure recognition) is used, the circuit netlist is traversed and structures (i.e., circuit patterns) embedded in software are recognized. However, it becomes virtually impossible to fully recognize the circuit netlist as the circuit's complexity increases.

If the rules of recognition are removed from the software, and instead are defined by separate, smaller circuit netlists (templates), a fully extensible classification methodology may be realized. Software recompilation is not required to extend the abilities of the classifier to identify circuits, and classification may easily be enhanced by creating new templates defining the new objects to be automatically identified.

SUMMARY OF EMBODIMENTS OF THE PRESENT INVENTION

A method and apparatus for performing template-based classification of a circuit design are disclosed. A template file is read that defines a plurality of channel-connected-region (CCR) templates. A graph is formatted for each of the CCR templates. A plurality of CCRs are identified based on a partitioned netlist file that defines a given circuit design. A graph is generated for each of the identified CCRs. A matching CCR template graph is identified for each generated CCR graph. The template file may further defines super-CCR templates, and a graph may be formatted for each of the super-CCR templates. All possible combinations of CCRs and previously-matched super-CCRs that are candidates to match the formatted super-CCR template graph may be determined in an interative manner, for each formatted super-CCR template graph. A determination may be made as to which of the candidate combinations actually match the formatted super-CCR template graph.

BRIEF DESCRIPTION OF THE DRAWINGS

A more detailed understanding may be acquired from the following description, given by way of example in conjunction with the accompanying drawings:

FIG. 6 shows an example of a matched CCR;

FIG. 9 shows an example of an input variation (IV) template; and

DETAILED DESCRIPTION

Template-based classification, which utilizes well-understood algorithms for graph matching, allows a flat or hierarchical circuit netlist file to be partitioned with channel-connected-region (CCR) boundaries. Partitions may be recognized by graph (topology and property) matching and structure recognition.

A template is a specific circuit topology that either includes transistors or instances of other templates, but not both. CCR templates only include transistors.

Figure 1:
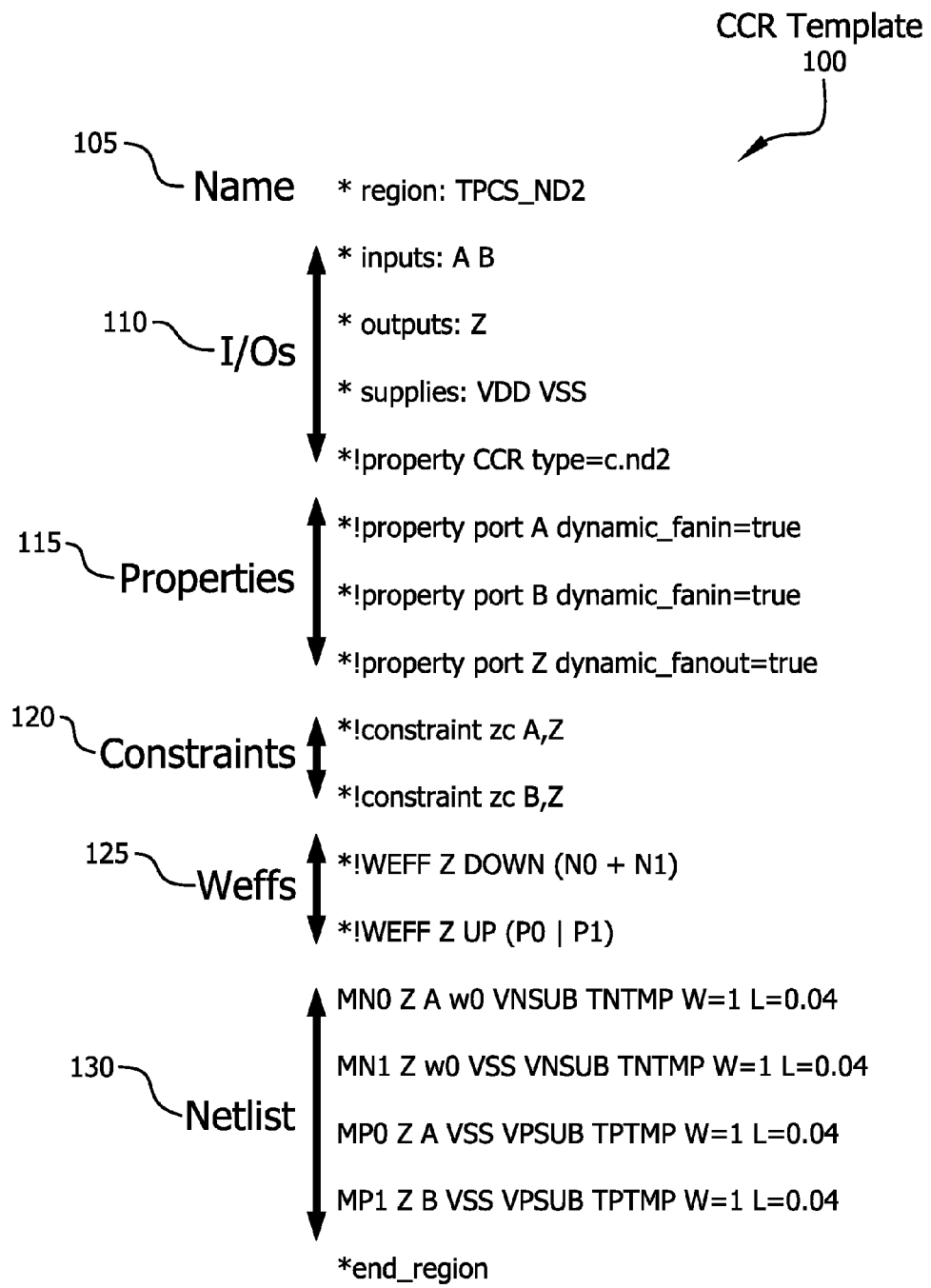
FIG. 1 shows an example of a channel-connected-region (CCR) template.

FIG. 1 shows an example of a CCR template 100 including a name 105, inputs and outputs (I/Os) 110, properties 115, constraints 120, Weffs (effective composite transistor widths) 125 and a netlist 130. The properties, constraints and Weffs are optional.

Super-CCR templates only include CCR templates or other super-CCR templates. Each template contains a list of I/Os, which must be included when graph-matching against the design. Furthermore, each template contains properties (device, net, port, template) and constraints that are overlaid on the parts of the design that matches the template.

Figure 2:
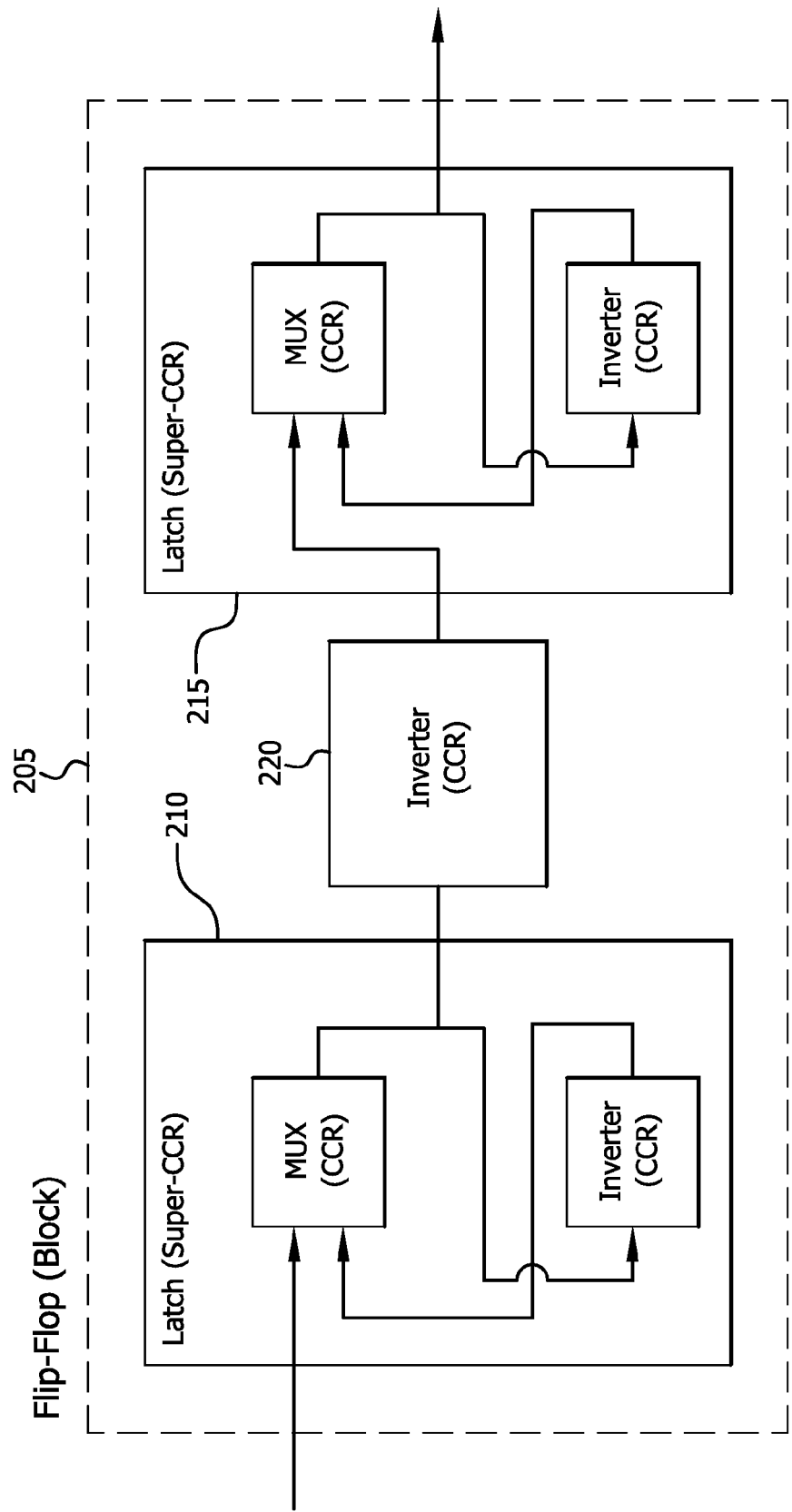
FIG. 2 shows a simplified example of template hierarchy.

FIG. 2 shows a simplified example of template hierarchy, whereby a CCR block template 205 includes two super-CCR templates 210 and 215, and a CCR template 220.

Figure 3:
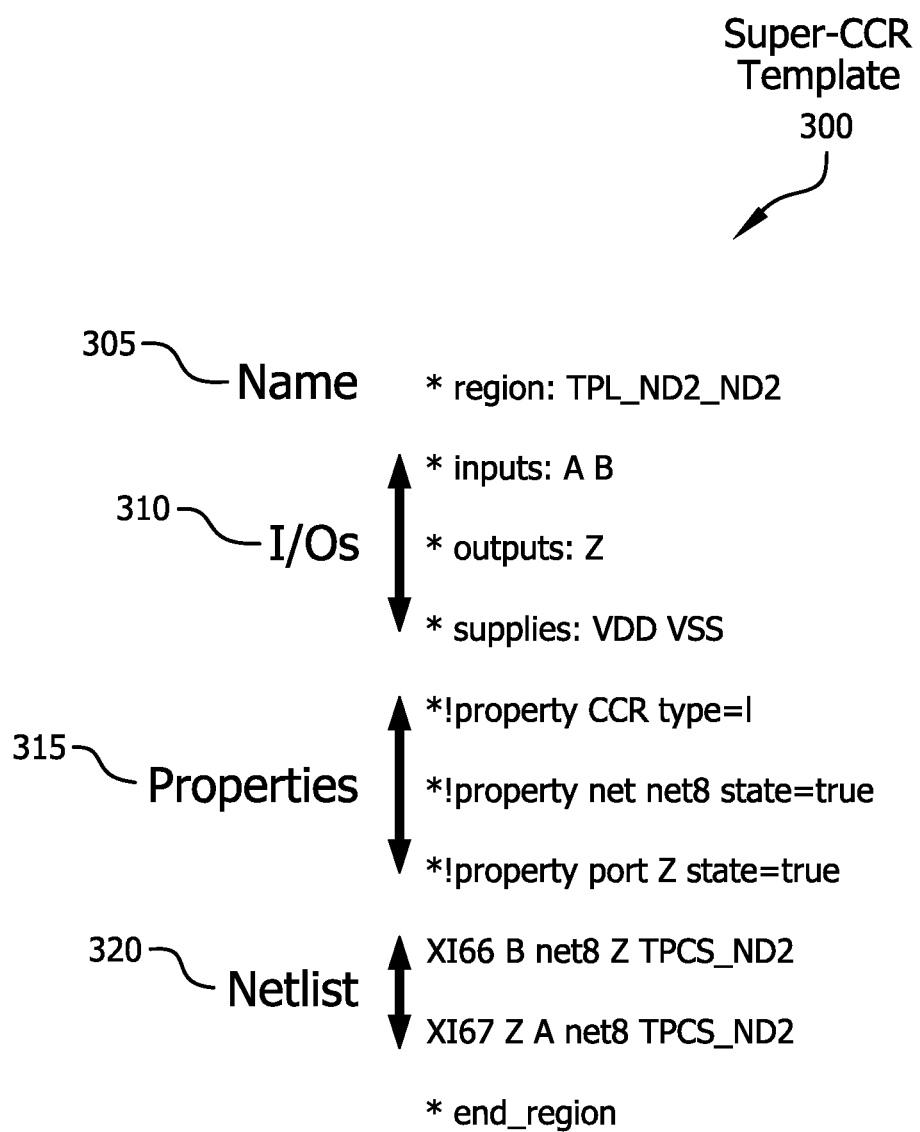
FIG. 3 shows an example of a super-CCR template.

FIG. 3 shows an example of a super-CCR template 300 including a name 305, I/Os 310, properties 315 and a netlist 320.

During logical analysis, classification is needed for template verification, logical equivalence checking, gate-level simulation and constraint checking. Verilog is a hardware description language (HDL) used to model electronic circuits. A Verilog-SPICE co-simulation may be used to verify that a template Verilog model accurately represents the function of the circuit (i.e., transistors). For the co-simulation, template constraints are used to detect and eliminate illegal conditions from the circuit pattern space. Template constraints are derived during classification. A comparison of the resulting vectors must be equivalent.

Logical equivalence checking (LEC) constraints may be used to reduce the formal checking space. These LEC constraints may be obtained from the templates during classification.

Gate-level simulation is used to perform logical analysis. Gate-level assertions may be used to monitor the usage correctness of circuit templates. Gate-level assertions may be derived from template constraints, which are derived during classification.

Constraint checking formally proves that the template circuit elements are used in a valid way. The key components of constraint checking are classification, proving constraints using formal tools, translating unproven constraints into assertions, and constraint management.

Figure 4:
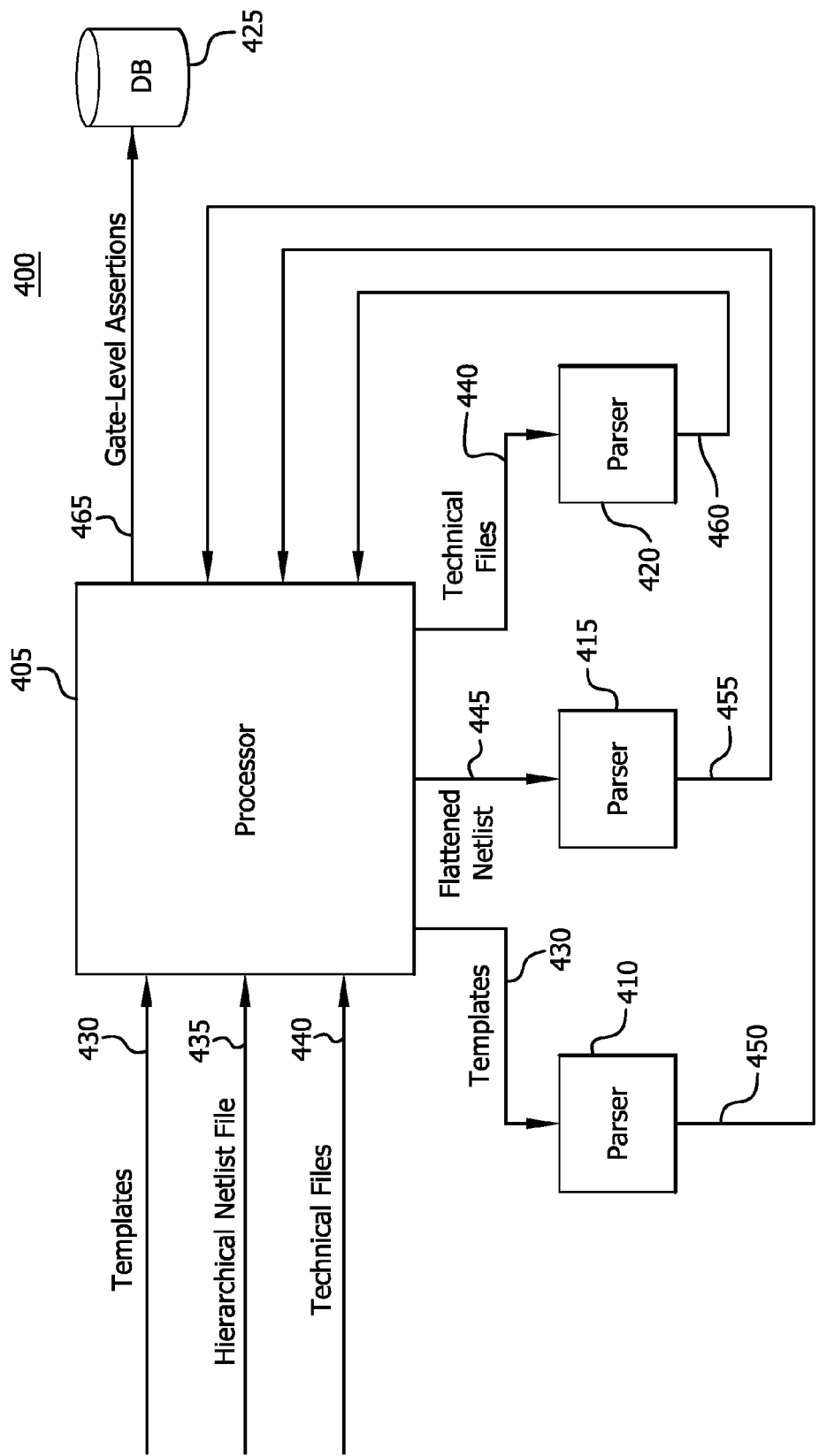
FIG. 4 shows an example of an apparatus for performing template-based classification of a circuit design.

FIG. 4 shows an example of an apparatus 400 for performing template-based classification. The apparatus includes a processor 405, a first parser 410, a second parser 415, a third parser 420 and a database 425. Although the parsers 410, 415 and 420 and the database 425 are illustrated as being components that are separate from the processor 405, it should be understood by one skilled in the art that the parsers 410, 415 and 420, and the database 425 may be incorporated into the processor 405. Furthermore, the functions performed by the parsers 410, 415 and 420 may be performed by software, rather than by a physical circuit or device.

Figure 5A:
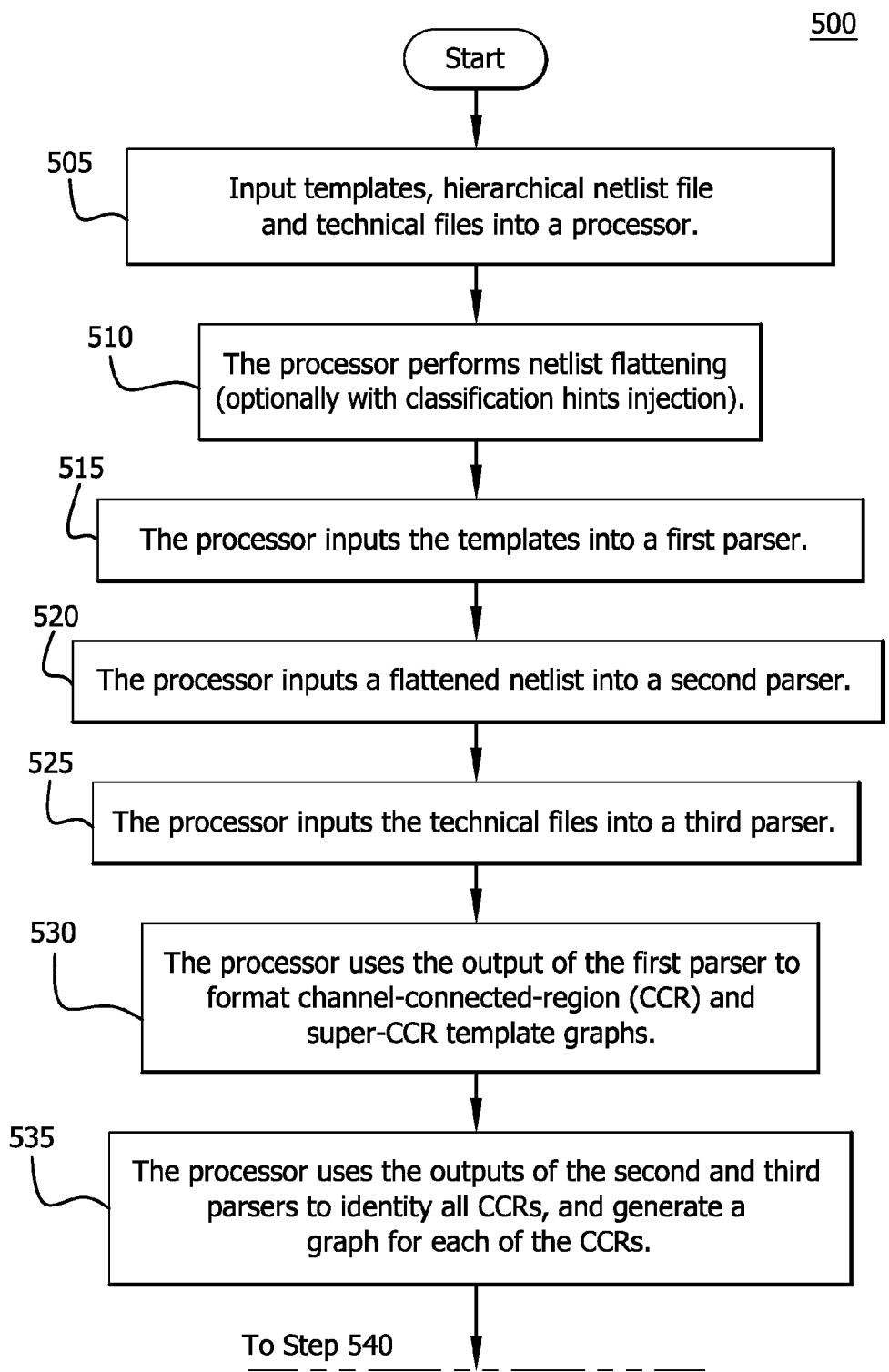
FIGS. 5A and 5B, taken together, are a flow diagram of a procedure for performing template-based classification of a circuit design using the apparatus of FIG. 4.
Figure 5B:
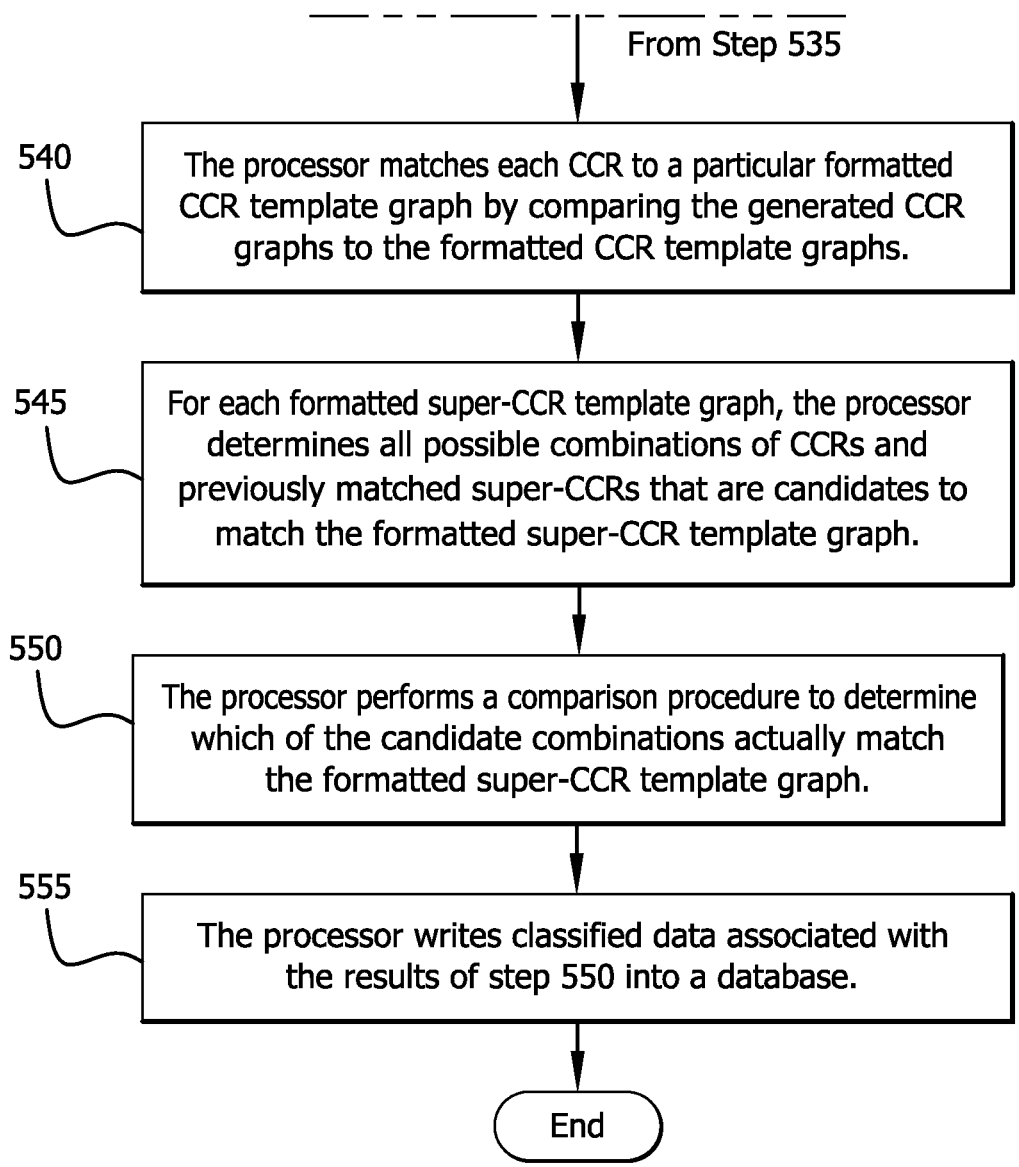

FIGS. 5A and 5B, taken together, are a flow diagram of a procedure 500 for performing template-based classification of a circuit design using the apparatus 400. Referring to both FIGS. 4 and 5A, in step 505, templates 430, a hierarchical netlist file 435 that defines a given circuit design, and technical files 440 are input into (i.e., received by) the processor 405. In step 510, the processor 405 performs netlist flattening, which optionally may include classification hints injection. Hints are comments placed at the end a transistor instance of a circuit netlist, and are used to guide classification. The hints never induce a false match to a template, but they indicate templates that a particular transistor may be compared to, and in what order the comparison should proceed to accelerate the classification procedure. In step 515, the processor 405 inputs the templates 430 into the first parser 410. In step 520, the processor 405 inputs a flattened netlist 445 into the second parser 415. The flattened netlist 445 contains no sub-circuit instances, which are hierarchical references to other groups of transistors, and only includes transistor primitives. In step 525, the processor 405 inputs the technical files 440 into the parser the third parser 420.

Still referring to FIGS. 4 and 5A, in step 530, the processor 405 uses the output 450 of the first parser 410 to format CCR and super-CCR template graphs. In step 535, the processor 405 uses the output 455 of the second parser 415 and the output 460 of the third parser 420 to identify all CCRs, and generate a graph for each of the CCRs.

Referring to FIGS. 4 and 5B, in step 540, the processor 405 matches each CCR to a particular formatted CCR template graph by comparing the generated CCR graphs to the formatted CCR template graphs. In step 545, for each formatted super-CCR template graph, the processor 405 determines all possible combinations of CCRs and previously matched super-CCRs that are candidates to match the formatted super-CCR template graph. In step 550, the processor 405 performs a comparison procedure to determine which of the candidate combinations actually match the formatted super-CCR template graph. In step 555, the processor 405 writes classified data (i.e., gate-level assertions 465) associated with the results of step 550 into a database.

A CCR is defined as "proven" if one and only one template is associated with each CCR. A "proven" super-CCR is defined as a collection of design CCRs and/or super-CCRs that uniquely match to one and only one template without colliding with another super-CCR template.

When the validity of CCRs is "proved" during the classification procedure 500, only one template is found that matches a particular CCR, whereby there is a one-to-one mapping for every transistor device, or net, (i.e., a named connection to one or more terminals of one or more transistor devices), in the circuit to a template counterpart. The properties, Weffs, states, constraints and the like are properly associated to the matched template circuit.

A CCR is "unproven" if there is no match, whereby no applicable template was found that matches a given CCR. Furthermore, if there are multiple matches, where there is more than one template that matches the given CCR, the CCR is "unproven". FIG. 6 shows an example of a matched CCR.

Figure 7:
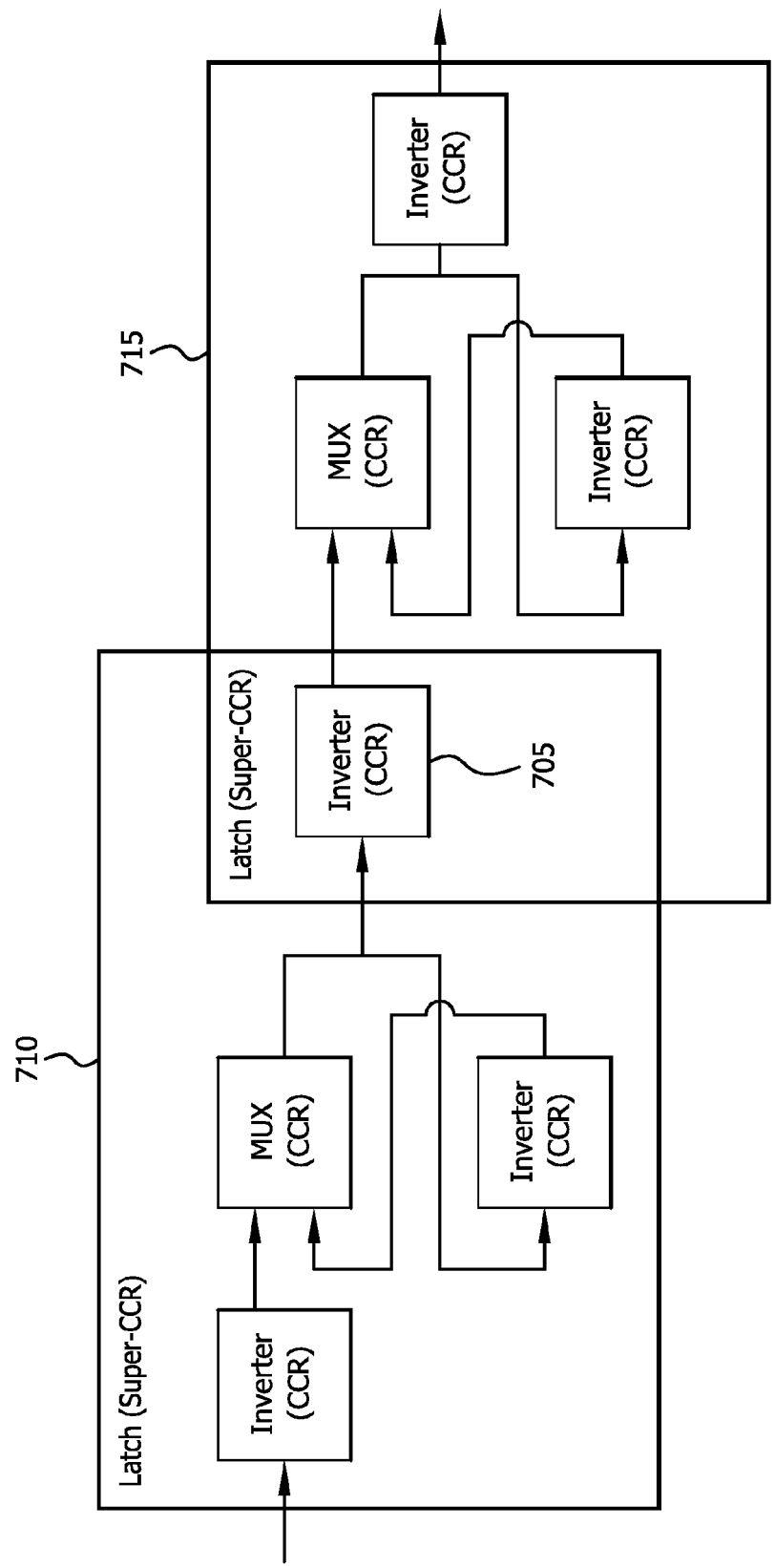
FIG. 7 shows an example of a template device collision.

Each CCR and super-CCR may or may not be a member of another super-CCR. As such, super-CCRs do not have a clean definition of "proven" that is similar to CCRs. Instead, a super-CCR is defined as "proven" if it contains a unique set of CCRs and super-CCRs that do not overlap with another super-CCR. The only overlap allowed is a complete overlap of the super-CCR, because one instantiates the other. FIG. 7 shows an example of this overlap, or "device collision", in which the CCR 705 is a member of two super-CCRs, 710 and 715, neither of which is fully contained within the other. This is not desirable as it indicates either a faulty circuit, or a faulty template. In addition, a series of heuristic checks are run after classification to ensure that all expected super-CCRs were in fact found, or "proven". CCRs are matched first, and then connected CCRs are iteratively combined for a possible super-CCR match. The iterative approach is required to allow for super-CCRs which contain other super-CCRs, and the number of iterations sets the maximum levels of hierarchy a super-CCR may have.

Figure 8:
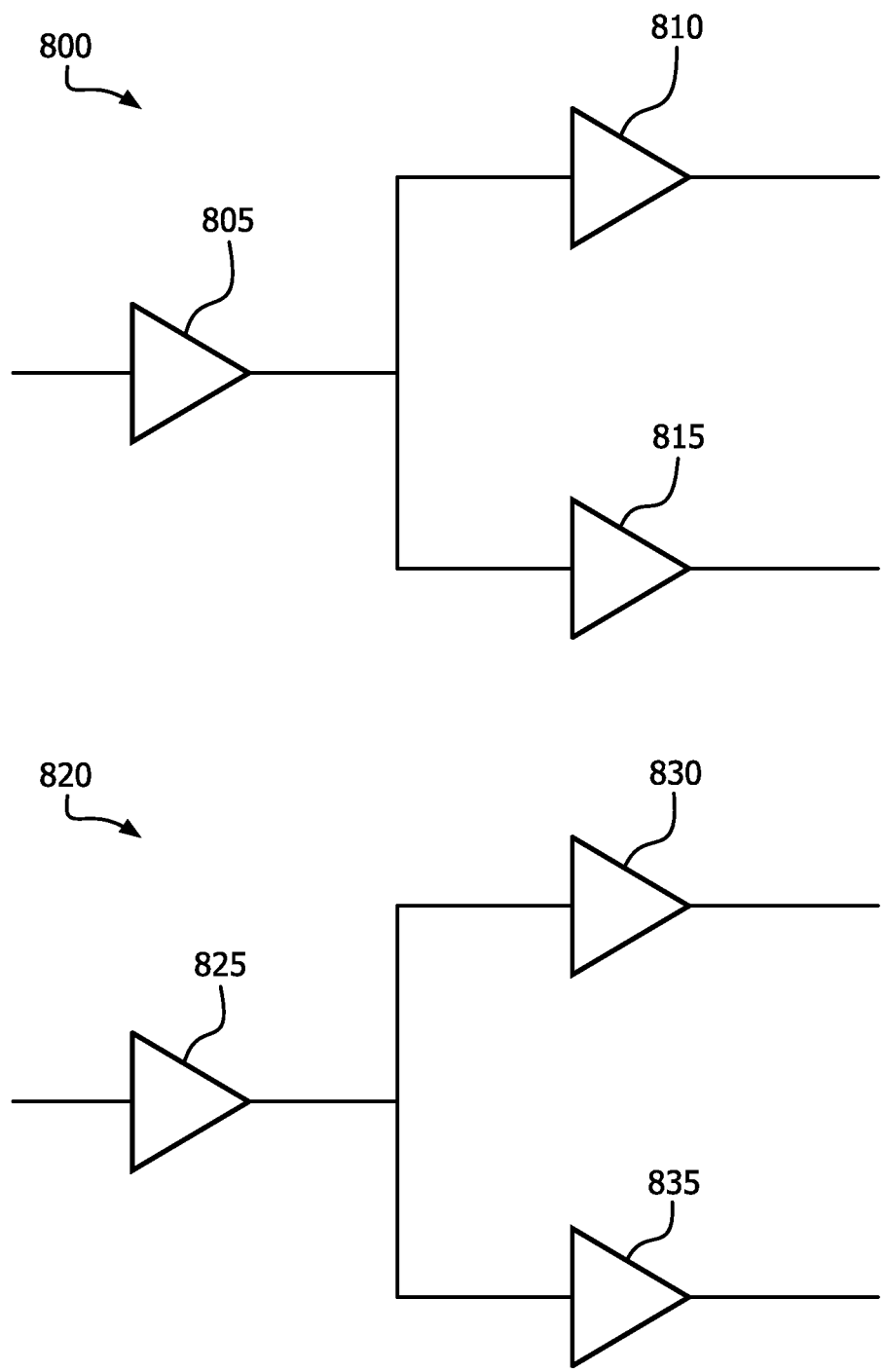
FIG. 8 shows an example of identical circuits that are compared together to determine whether they match.

FIG. 8 shows an example of identical circuits that are compared together to determine whether they match. As shown in FIG. 8, a circuit 800 includes components 805, 810 and 815, and a template 820 includes components 825, 830 and 835. The circuit 800 will match the template 820 in two ways. In one way, component 805 matches component 825, component 810 matches component 830, and component 815 matches component 835. In the other way, component 805 matches component 825, component 810 matches component 835, and component 815 matches component 830. Hints may be automatically generated to enable the user to determine which is the correct or preferred template that matches circuit 800.

FIG. 9 shows an example of an input variation (IV) template 900. An IV template has the same topology as another, non-IV template, but with one or more input ports connected together. Any template with multiple input ports may have associated IV templates. How the input ports are connected together is recorded in the IV template. IV templates may be automatically created from their associated non-IV templates, and are essential to reduce the number of unique templates that must be maintained.

Figure 10:
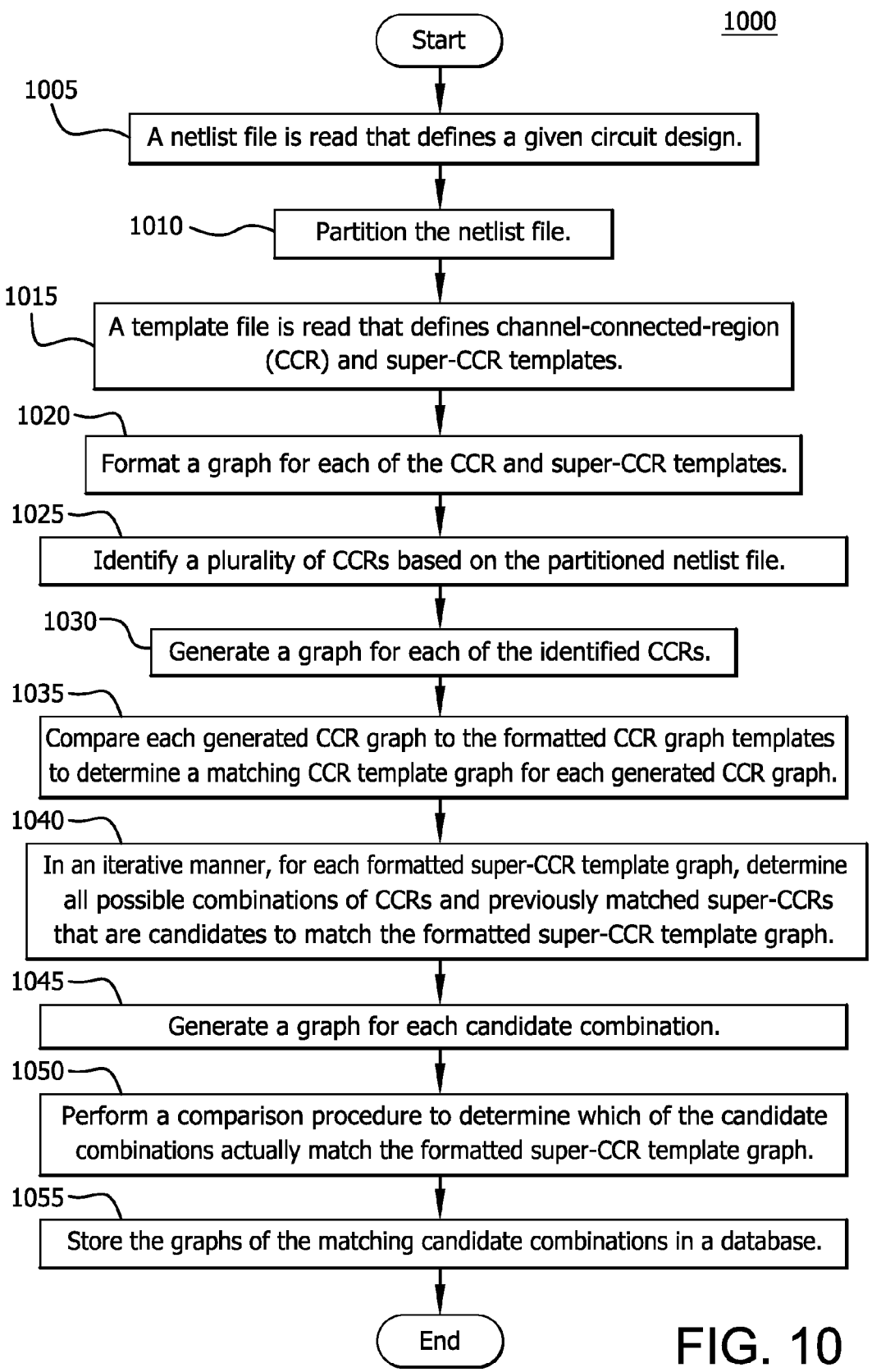
FIG. 10 is a flow diagram of a procedure for performing template-based classification of a circuit design.

FIG. 10 shows a procedure 1000 for performing template-based classification of a circuit design. The procedure 1000 may be performed by the apparatus 400 of FIG. 4, by a processor, or by a computer-readable medium running on the processor.

Referring to FIG. 10, in step 1005, a netlist file is read that defines a given circuit design. Before being read, the netlist file may be flattened with classification hints injection. In step 1010, the netlist file is partitioned. In step 1015, a template file is read that defines CCR and super-CCR templates. In step 1020, a CCR graph is formatted for each of the CCR and super-CCR templates. In step 1025, a plurality of CCRs are identified based on the partitioned netlist file. In step 1030, a graph is generated for each of the identified CCRs. In step 1035, each generated CCR graph is compared to the formatted CCR graph templates to determine a matching CCR template graph for each generated CCR graph. In step 1040, for each formatted super-CCR template graph, all possible combinations of CCRs and previously matched super-CCRs that are candidates to match the formatted super-CCR template graph are iteratively determined in an iterative manner. In step 1045, a graph is generated for each candidate combination. In step 1050, a comparison procedure is performed to determine which of the candidate combinations actually match the formatted super-CCR template graph. In step 1055, the graphs of the matching candidate combinations are stored in a database.

Each of the CCRs defines a collection of transistors used to form a circuit. Each of the super-CCR template graphs defines a plurality of CCRs and/or super-CCRs that are interconnected.

Also, in conjunction with steps 1005 and 1015 of the procedure 1000 of FIG. 10, a plurality of technical files may also be read. The technical files define what the types of transistors are, and what the power supply names are. The power supply names define how CCRs are partitioned.

Different ones of the CCR template graphs may be combined to determine whether there is a matching formatted super-CCR template graph. Furthermore, different ones of the CCR template graphs and super-CCR template graphs may be combined to determine whether there is a matching formatted super-CCR template graph.

Although features and elements are described above in particular combinations, each feature or element can be used alone without the other features and elements or in various combinations with or without other features and elements. The apparatus described herein may be manufactured using a computer program, software, or firmware incorporated in a computer-readable storage medium for execution by a general purpose computer or a processor. Examples of computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

Embodiments of the present invention may be represented as instructions and data stored in a computer-readable storage medium. For example, aspects of the present invention may be implemented using Verilog, which is a hardware description language (HDL). When processed, Verilog data instructions may generate other intermediary data, (e.g., netlists, GDS data, or the like), that may be used to perform a manufacturing process implemented in a semiconductor fabrication facility. The manufacturing process may be adapted to manufacture semiconductor devices (e.g., processors) that embody various aspects of the present invention.

Suitable processors include, by way of example, a general purpose processor, a special purpose processor, a conventional processor, a digital signal processor (DSP), a plurality of microprocessors, a graphics processing unit (GPU), a DSP core, a controller, a microcontroller, application specific integrated circuits (ASICs), field programmable gate arrays (FPGAs), any other type of integrated circuit (IC), and/or a state machine, or combinations thereof.

What is claimed is:

1. A method of a processor performing template-based classification of a circuit design, the method comprising:
   the processor reading a template file that defines a plurality of channel-connected-region (CCR) templates and super-CCR templates;
   the processor formatting a graph for each of the CCR templates and super-CCR templates;
   the processor identifying a plurality of CCRs based on a partitioned netlist file that defines a given circuit design;
   the processor generating a graph for each of the identified CCRs;
   the processor identifying a matching CCR template graph for each generated CCR graph; and
   the processor determining in an interative manner, for each formatted super-CCR template graph, all possible combinations of CCRs and previously-matched super-CCRs that are candidates to match the formatted super-CCR template graph.

2. The method of claim 1, wherein each of the super-CCR template graphs defines at least one of a plurality of CCRs or a plurality of super-CCRs that are interconnected, the method further comprising:
   the processor generating a graph for each candidate combination; and
   the processor determining which of the candidate combinations actually match the formatted super-CCR template graph.

3. The method of claim 2 further comprising:
   the processor storing in a database the graphs of the candidate combinations that are determined to actually match the formatted super-CCR template graph.

4. The method of claim 1 wherein each of the CCRs defines a collection of transistors used to form a circuit.

5. The method of claim 1 further comprising:
   the processor reading a plurality of technical files; and
   the processor identifying how to partition and graph-match CCRs based on the technical files.

6. The method of claim 5 wherein the technical files define transistor types and power supply names that indicate how CCRs are partitioned.

7. The method of claim 1 further comprising:
   the processor combining different ones of at least one of a plurality of CCR graphs or super-CCR graphs to determine whether there is a matching formatted super-CCR template graph.

8. The method of claim 1 further comprising:
   the processor flattening the netlist file with classification hints injection.

9. An apparatus for performing template-based classification of a circuit design, the apparatus comprising:
   a processor configured to read a template file that defines a plurality of channel-connected-region (CCR) templates and super-CCR templates, format a graph for each of the CCR templates and super-CCR templates, identify a plurality of CCRs based on a partitioned netlist file that defines a given circuit design, generate a graph for each of the identified CCRs, and identify a matching CCR template graph for each generated CCR graph, and determine in an interative manner, for each formatted super-CCR template graph, all possible combinations of CCRs and previously-matched super-CCRs that are candidates to match the formatted super-CCR template graph.

10. The apparatus of claim 9 wherein each of the super-CCR template graphs defines at least one of a plurality of CCRs or a plurality of super-CCRs that are interconnected, and the processor is further configured to generate a graph for each candidate combination, and determine which of the candidate combinations actually match the formatted super-CCR template graph.

11. The apparatus of claim 10 further comprising:
a database configured to store the graphs of the candidate combinations that are determined to actually match the formatted super-CCR template graph.

12. The apparatus of claim 9 wherein each of the CCRs defines a collection of transistors used to form a circuit.

13. The apparatus of claim 9 wherein the processor is further configured to read a plurality of technical files and identify how to partition and graph-match CCRs based on the technical files.

14. An apparatus for performing template-based classification of a circuit design, the apparatus comprising:
a processor configured to receive templates, a netlist file that defines a given circuit design, and technical files, wherein the processor performs netlist flattening and outputs a flattened netlist, the templates and the technical files;
a first parser configured to partition the templates, wherein the processor is further configured to use an output of the first parser to format channel-connected- region (CCR) and super-CCR template graphs;
a second parser configured to partition the flattened netlist; and
a third parser configured to partition the technical files.

15. The apparatus of claim 14 wherein the processor is further configured to use outputs of the second and third parsers to identify all CCRs, and generate a graph for each of the CCRs.

16. The apparatus of claim 15 wherein the processor is further configured to match each CCR to a particular formatter CCR template graph by comparing the generated CCR graphs to the formatted CCR template graphs.

17. The apparatus of claim 16 further comprising a database wherein, for each formatted super-CCR template graph, the processor is further configured to determine all combinations of CCRs and previously matched super- CCRs that are candidates to match the formatted super-CCR template graph, determine results indicating which of the candidate combinations actually match the formatted super-CCR template graph, and write classified data associated with the results into the database.

18. A non-transitory computer-readable storage medium containing a set of instructions for performing template-based classification of a circuit design, the set of instructions comprising:
a first instruction for reading a template file that defines a plurality of channel-connected-region (CCR) templates and super-CCR templates;
a second instruction for formatting a graph for each of the CCR templates and super-CCR templates;
a third instruction for identifying a plurality of CCRs based on a partitioned netlist file that defines a given circuit design;
a fourth instruction for generating a graph for each of the identified CCRs;
a fifth instruction for identifying a matching CCR template graph for each generated CCR graph; and
a sixth instruction for identifying a matching CCR template graph for each generated CCR graph, and determine in an iterative manner, for each formatted super-CCR template graph, all possible combinations of CCRs and previously-matched super-CCRs that are candidates to match the formatted super-CCR template graph.

19. The non-transitory computer-readable storage medium of claim 18 wherein each of the super-CCR template graphs defines at least one of a plurality of CCRs or a plurality of super-CCRs that are interconnected.

20. The non-transitory computer-readable storage medium of claim 18 wherein the set of instructions further comprises:
a seventh instruction for generating a graph for each candidate combination; and
an eighth instruction for determining which of the candidate combinations actually match the formatted super-CCR template graph.

* * * * *